United States Patent [19]
Yamada

[11] Patent Number: 5,643,422
[45] Date of Patent: Jul. 1, 1997

[54] REACTIVE SPUTTERING SYSTEM FOR DEPOSITING TITANIUM NITRIDE WITHOUT FORMATION OF TITANIUM NITRIDE ON TITANIUM TARGET AND PROCESS OF DEPOSITING TITANIUM NITRIDE LAYER

[75] Inventor: Yoshiaki Yamada, Tokyo, Japan

[73] Assignee: NEC Corporation, Japan

[21] Appl. No.: 580,393

[22] Filed: Dec. 28, 1995

[30] Foreign Application Priority Data

Dec. 29, 1994 [JP] Japan .................................. 6-338703

[51] Int. Cl.$^6$ .................................................. C23C 14/34
[52] U.S. Cl. ........................ 204/192.15; 204/298.11; 204/298.13; 204/298.19
[58] Field of Search ................... 204/192.12, 192.15, 204/298.11, 298.19, 192.17, 298.12, 298.13

[56] References Cited

U.S. PATENT DOCUMENTS

| | | | |
|---|---|---|---|
| 4,428,812 | 1/1984 | Sproul | 204/192 |
| 4,824,544 | 4/1989 | Mikalesen et al. | 204/298.11 X |
| 4,895,765 | 1/1990 | Sue et al. | 428/627 |
| 5,155,063 | 10/1992 | Ito | 437/190 |
| 5,242,860 | 9/1993 | Nulman et al. | 437/190 |
| 5,382,339 | 1/1995 | Aranovich | 204/192.12 |
| 5,419,029 | 5/1995 | Raaijmakers | 204/298.11 X |
| 5,512,155 | 4/1996 | Fukasawa | 204/298.11 |
| 5,529,670 | 6/1996 | Ryan et al. | 204/298.11 X |

FOREIGN PATENT DOCUMENTS

| | | |
|---|---|---|
| 1-116070 | 5/1989 | Japan . |
| 1-184276 | 7/1989 | Japan . |
| 5-13368 | 1/1993 | Japan . |

OTHER PUBLICATIONS

"Reactively Sputtered Coherent TiN Process For Sub–0.5um Technology"; Dixit et al; Jun. 8–9, 1993; VMIC Conference; pp. 433–435.

"Single Chamber Implementation Of A Coherent Ti/TiN Process For Sub–Half Micron Technologies"; Ramaswami et al; Jun. 8–9, 1993; VMIC Conference; pp. 439–441.

"Development Of A Coherent Ti/TiN Process For Sub–Half Micron Technologies"; Ramaswami et al; pp. 215–221; Conference Proceedings ULSI–IX 1994.

"Manufacturability Aspects Of A Single Chamber Coherent Ti/TiN Process"; Ramaswami et al; Conference Proceedings ULSI–IX 1994; pp. 555–559.

Primary Examiner—Nam Nguyen
Attorney, Agent, or Firm—Hayes, Soloway, Hennessey, Grossman & Hage, P.C.

[57] ABSTRACT

A titanium nitride layer is deposited on a semiconductor substrate through a magnetron sputtering using a titanium target, and the sputtered surface is mainly formed by (001) crystal surfaces, at least 90 percent of which have respective <001> directions falling within 30 degrees with respect to a normal line to the a major surface of the semiconductor substrate, thereby preventing the sputtered surface from nitriding.

13 Claims, 4 Drawing Sheets

5,643,422

REACTIVE SPUTTERING SYSTEM FOR DEPOSITING TITANIUM NITRIDE WITHOUT FORMATION OF TITANIUM NITRIDE ON TITANIUM TARGET AND PROCESS OF DEPOSITING TITANIUM NITRIDE LAYER

FIELD OF THE INVENTION

This invention relates to a sputtering used in a fabrication of a semiconductor integrated circuit device and, more particularly, to a reactive sputtering system for depositing titanium nitride and a process of depositing titanium nitride.

DESCRIPTION OF THE RELATED ART

A progressive miniaturization of circuit components requires a new wiring structure, and titanium nitride is attractive to semiconductor manufacturers for fabricating the new wiring structure.

One of the applications of the titanium nitride is a barrier metal layer against a mutual diffusion between aluminum and silicon. When aluminum alloy is deposited on a silicon substrate exposed to a contact hole, the aluminum and the silicon are mutually diffused into each other, and the diffused aluminum forms an aluminum spike. A shallow p-n junction is usually incorporated in a miniature circuit component. If the aluminum and the silicon is mutually diffused over the shallow p-n junction, the aluminum spike penetrates through the shallow p-n junction, and short-circuits the aluminum alloy wiring with the silicon substrate. On the other hand, the silicon tends to precipitate around the boundary between the aluminum allow and the silicon layer, and form a barrier against a electric signal. However, a barrier metal layer prevents the silicon and aluminum from the mutual diffusion, and the titanium nitride is available for the barrier metal layer.

Another application is to enhance the adhesion between an inter-level insulating layer and a tungsten plug. The miniaturization of the circuit components deteriorates the aspect ratio of a contact hole formed in the inter-level insulating layer, and an aluminum-based metal wiring is hardly connected through the contact hole. For this reason, the contact hole is plugged with refractory metal, and tungsten is desirable for the plug, because the tungsten forms a smooth step-coverage. However, the tungsten is liable to peel from the inter-level insulating layer. A titanium nitride layer anchors the titanium nitride layer to the inter-level insulating layer. The titanium nitride layer is usually sputtered on the inner wall defining the contact hole, and the tungsten is grown on the titanium nitride layer by using a chemical vapor deposition.

Yet another application is a barrier metal layer against the reactant gas in the chemical vapor deposition for the tungsten. Tungsten hexafluoride ($WF_6$) is used in the chemical vapor deposition, and reacts with the silicon exposed to the contact hole. The reactant damages the circuit components, and the barrier metal is required. If the titanium nitride is deposited to at least 10 nanometers thick on the bottom surface of the contact hole, the titanium nitride layer does not allow the tungsten hexafluoride to react with the silicon, and prevents the circuit component from the damage.

Thus, the titanium nitride has found a wide variety of application in the field of semiconductor integrated circuit device. However, the aspect ratio of contact holes is getting larger and larger, and the contact holes with a large aspect ratio make thick titanium nitride layers to uniformly cover the bottom surfaces thereof.

A coherent sputtering has been proposed so as to improve the bottom step coverage. A collimator is incorporated in the coherent sputtering system, and the collimator is placed between a target and a semiconductor wafer. A large number of through-holes are formed in the collimator, and allow sputtered particles nearly normal to the wafer to reach the surface of the wafer. When a target is bombarded, sputtered particles fly in a wide angle. The collimator allows only a part of the sputtered particles to pass therethrough, and theoretically decreases the deposition rate. However, it is compensated by increasing the sputtering power, and a fairly large deposition rate is achieved.

One of the coherent sputtering system is disclosed in Japanese Patent Publication of Unexamined Application No. 1-116070, the patent application of which was filed on the basis of U.S. patent application Ser. No. 114,896 field on Aug. 1, 1988. The Japanese Patent Publication of Unexamined Application discloses a magnetron sputtering system equipped with a particle collimate filter. The Japanese Patent Publication of Unexamined Application focuses the description on the magnetron sputtering system, especially, the collimate tube.

Another coherent sputtering system is disclosed in Japanese Patent Publication of Unexamined Application No. 1-184276. The sputtering system disclosed therein is a magnetron sputtering system, and bias conditions are taught in detail.

The coherent sputtering is available for deposition of the titanium nitride in the contact holes with a large aspect ratio. A titanium target is placed in a vacuum chamber of a coherent sputtering system, and nitrogen gas is introduced during the sputtering on the titanium target. The sputtered titanium reacts with the nitrogen, and the titanium nitride is deposited on a semiconductor substrate. Thus, the titanium nitride is deposited through the reactive sputtering.

However, the prior art reactive sputtering encounters a problem in that titanium nitride is produced on the sputtered surface of the titanium target, and the deposition rate of the titanium nitride is decreased to a third. This is because of the fact that the titanium nitride is much smaller in sputtering yield.

G. A. Dixit et. al. and Sesh Ramaswami et. al. propose solutions against the undesirable nitriding on the sputtered surface of the titanium target, and propose to nitride deposited titanium layers. G. A. Dixit reports the conditions of a reactive sputtering between a nitride mode and a non-nitride mode in "A REACTIVELY SPUTTERED COHERENT TiN PROCESS FOR SUB-0.5 micron TECHNOLOGY", Proceedings of 1993 VMIC Conference, pages 433 to 435. Sesh Ramaswami et. al. also reports a sequential deposited of titanium/titanium nitride in the metallic mode and the nitride mode in "SINGLE CHAMBER IMPLEMENTATION OF A COHERENT Ti/TiN PROCESS FOR SUB-HALF MICRON TECHNOLOGIES", Proceedings of 1993 VMIC Conference, pages 439 to 441.

The afore-mentioned Japanese Patent Publication of Unexamined Application No. 1-116070 teaches reactant gas introduced around the wafers reacts with the deposited substance without contamination of the sputtered surface.

As to the deposition rate and the deposited film quality, Japanese Patent Publication of Unexamined Application No. 5-13368 teaches that the orientation ratio of (001) surface has influences on the deposition rate and the film quality.

As described hereinbefore, the reactive coherent sputtering is desirable for the bottom step coverage in contact holes with a large aspect ratio. However, the titanium nitride tends to cover the sputtered surface of the titanium target, and decreases the deposition rate. Although the above described papers teach the formation of titanium nitride from the titanium deposited on the substrate, the formation of the titanium nitride requires strictly controlled partial pressure of the nitrogen as described hereinbelow, and the prior art processes are not feasible.

The present inventor carried out the reactive sputtering using a titanium target. The titanium target was 30 millimeters in diameter, and had the (001) surface orientation ratio at 70 percent. The (001) surface orientation ratio at 70 percent meant that the sputtered surface was created by (001) crystal surfaces 70 percent of which had respective <001> directions extending within 30 degrees with respect to the normal line to the sputtered surface. The titanium target was placed in a chamber of a coherent sputtering system. A collimate plate was provided between the titanium target and substrates. The collimate plate was 10 millimeters in thickness, and had holes 10 millimeters in diameter. The sputtering power was regulated to 10 kw, and the reactive sputtering was carried out by changing the flow rate of nitrogen. The nitrogen was carried by argon gas.

FIG. 1 shows the results of the experiment. If the flow rate of argon was less than the critical value indicated by broken line BL1, no discharge took place, and the sputtering was not carried out. While the flow rate of nitrogen was falling in the range A1, titanium nitride was not formed on both of the deposited layer and the titanium target. On the other hand, if the flow rate of nitrogen fell within the region A2, the titanium nitride was deposited on the substrate, and the titanium target was nitrided. However, if the nitrogen and the argon were controlled in the region A3, the titanium nitride was deposited on the substrate without nitriding the titanium target.

As will be understood from FIG. 1, the titanium nitride was deposited on the substrate without nitriding the titanium target under the condition of the extremely narrow flow rate range of 5 sccm. Although the flow rate of nitrogen was increased together with the flow rate of argon, the flow rate range was constant. This means that the fluctuation in flow rate or the partial pressure of nitrogen changes the deposited substance between the titanium nitride and the titanium, and varies the thickness of the deposited substance. Thus, the prior art reactive sputtering is hardly controllable, and is not available for a manufacturing process of a semiconductor integrated circuit device.

SUMMARY OF THE INVENTION

It is therefore an important object of the present invention to provide a sputtering system which stably grows a titanium nitride layer without nitriding a titanium target.

It is another object of the present invention to provide a process of depositing a titanium nitride layer which is easily controllable in a manufacturing of a semiconductor integrated circuit device.

To accomplish the object, the present invention proposes to increase a (001) surface orientation ratio of a sputtered surface.

In accordance with one aspect of the present invention, there is provided a sputtering system comprising: a vessel defining a vacuum chamber; a wafer holder accommodated in the vacuum chamber for maintaining a substrate; a target holder accommodated in the vacuum chamber; a plasma generating means for generating a plasma around the target holder; a target formed of titanium, and supported by the target holder, the target including a surface portion to be sputtered by an ion bombardment radiated from the plasma, the surface portion having (001) crystal surfaces, <001> directions of the (001) crystal surfaces falling within 30 degrees with respect to a normal line to the surface portion being equal to or greater than 90 percent of all the crystal surfaces forming the surface portion; and a gas supplying means supplying gaseous mixture containing nitrogen to the vacuum chamber so as to deposit a titanium nitride layer on the substrate.

In accordance with another aspect of the present invention, there is provided a process of depositing a titanium nitride layer on a substrate, comprising the steps of: a) preparing a target formed of titanium and having a surface portion to be sputtered, the surface portion having (001) crystal surfaces, <001> directions of the (001) crystal surfaces falling within 30 degrees with respect to a normal line to the surface portion being equal to or greater than 90 percent of all the crystal surfaces forming the surface portion; b) accommodating the target and a substrate in a vacuum chamber; c) evacuating the vacuum chamber; d) supplying gaseous mixture containing nitrogen to the vacuum chamber; e) generating a plasma in the vacuum chamber so as to sputter the target, sputtered titanium particles reacting with the nitrogen so that titanium nitride is deposited on the substrate.

BRIEF DESCRIPTION OF THE DRAWINGS

The features and advantages of the sputtering system and the deposition process according to the present invention will be more clearly understood from the following description taken in conjunction with the accompanying drawings in which.

DESCRIPTION OF THE PREFERRED EMBODIMENTS

First Embodiment

Figure 2:
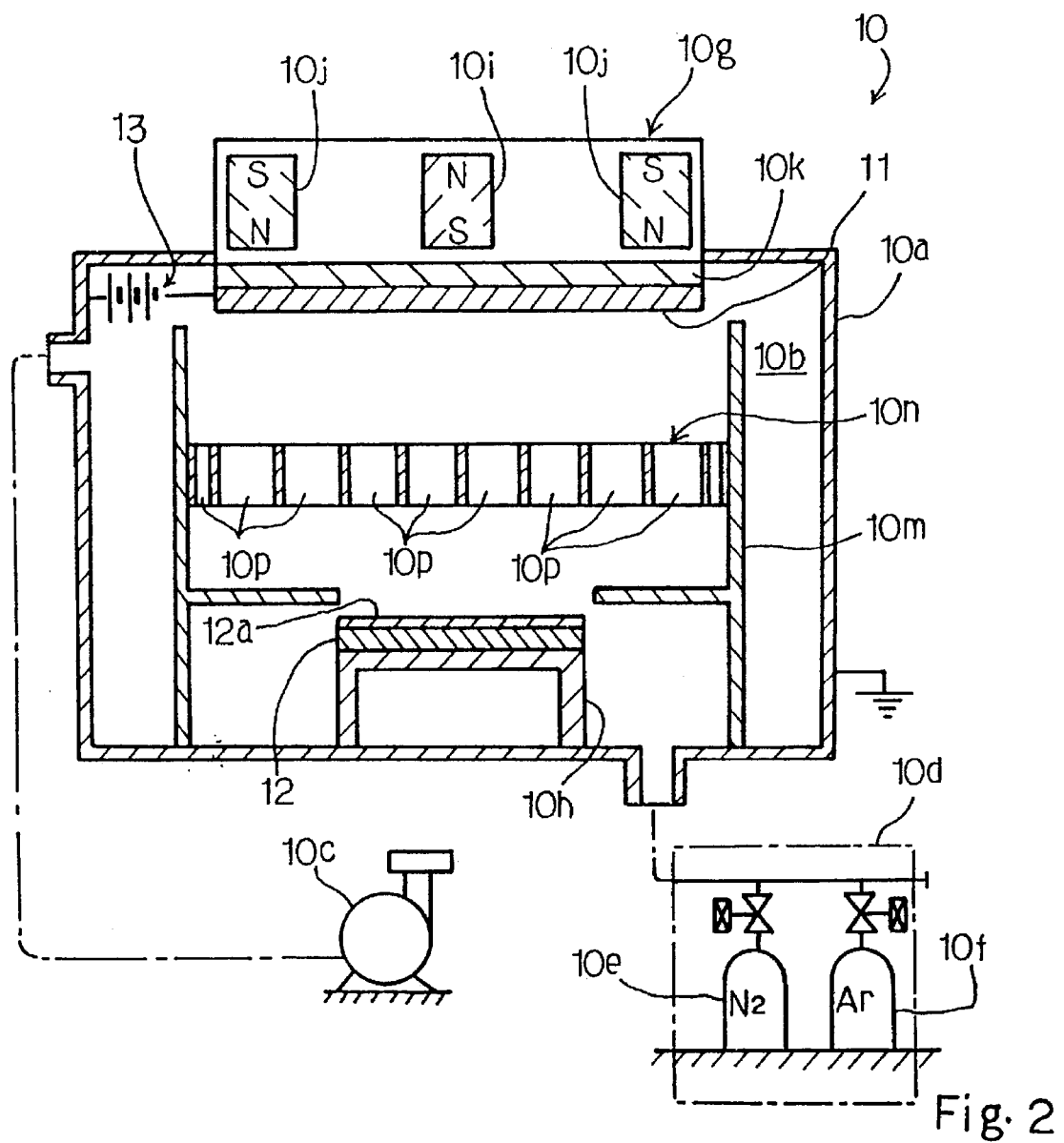
FIG. 2 is a schematic cross sectional view showing a sputtering system according to the present invention.
Figure 3:
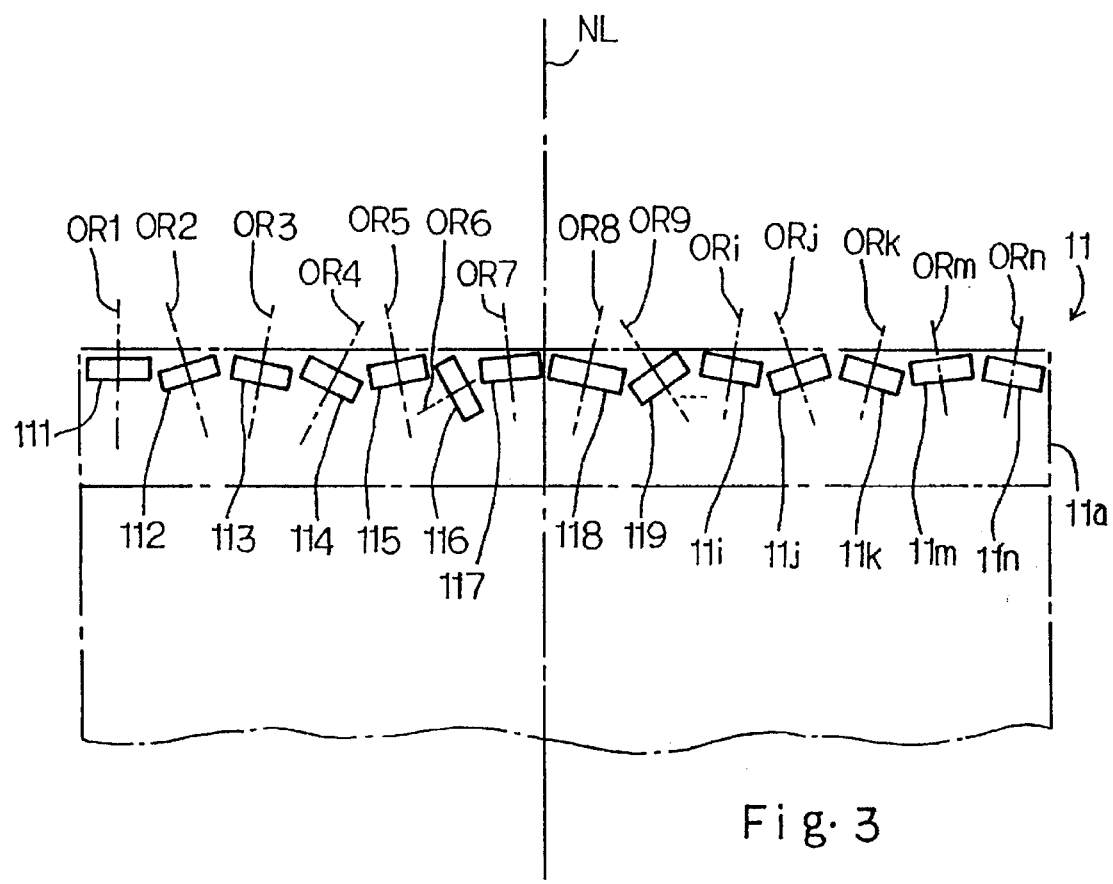
FIG. 3 is a schematic view showing crystal surfaces forming a surface portion of a target used in the sputtering system according to the present invention.

Referring to FIG. 2 of the drawings, a magnetron sputtering system 10 embodying the present invention comprises a reactor 10a, and a chamber 10b is defined in the reactor 10a. The chamber 10b is connected to a vacuum pump 10c and a gas supply sub-system 10d, and a source 10e of nitrogen gas and a source 10f of argon gas are incorporated in the gas supply sub-system 10d.

The magnetron sputtering system 10 further comprises a magnet assembly 10g attached to a backing plate member 10k and a substrate holder 10h confronted with the backing plate member 10k. A titanium target 11 is attached to the backing plate member 10k, and a semiconductor wafer 12 is placed on the substrate holder 10h. A direct current source 13 is connected to the titanium target 11, and negatively biases the titanium target 11.

The magnet assembly 10g serves as a planer magnetron sputtering electrode, and includes a center magnet 10i and a ring-shaped peripheral magnet 10j. The ring-shaped peripheral magnet 10j is opposite in polarity to the center magnet 10i, and the center magnet 10i and the ring-shaped peripheral magnet 10j create a magnetic field through the backing plate member 10k around the titanium target 11.

The magnetron sputtering system 10 further comprises a shield structure 10m accommodated in the chamber 10b and a collimator 10n supported by the shield structure 10m. The shield structure 10m prevents the inner wall of the reactor 10a from contamination due to sputtered substance. A plurality of through-holes 10p are formed in the collimator 10n, and provides a path for the sputtered particles. The collimator 10n is 10 millimeters in thickness, and the diameter of the through-holes 10p is 10 millimeters. The through-holes 10p eliminates obliquely projected sputtered particles, and allows sputtered particles projected in the normal direction to reach the upper surface of the semiconductor wafer 12.

The titanium target 11 is shaped in a disk configuration, and the diameter of the titanium target 11 is 300 millimeters. The titanium target 11 has a surface portion 11a to be sputtered, and (001) crystal surfaces 111, 112, 113, 114, 115, 116, 117, 18, 119, ... 11i, 11j, 11k, 11m and 11n form the surface of the titanium target 11 to be sputtered. The (001) crystal surfaces have respective <001> directions OR1, OR2, OR3, OR4, OR5, OR6, OR7, OR8, OR9, ORi, ORj, ORk, ORm and ORn, and most of the <001> directions OR1 to ORn fall within 30 degrees with respect to a normal line NL to the surface to be sputtered. In this instance, the <001> directions OR6 and OR9 are greater than 30 degrees with respect to the normal line NL. However, the <001> directions falling within 30 degrees are equal to or greater than 90 percent with respect to all the (001) crystal surfaces 111 to 11n.

A titanium nitride layer is deposited on the semiconductor wafer as follows. First, the titanium target 11 is attached to the backing plate member 10k, and the semiconductor wafer 12 is placed on the substrate holder 10h. The vacuum pump 10c evacuates the chamber 10b, and, thereafter, gaseous mixture is introduced in the chamber 10b. The chamber 10b is maintained at 2 milli-torr. The gaseous mixture contains nitrogen gas at 20 sccm and argon gas at 20 sccm.

Subsequently, the direct current source 13 negatively biases the titanium target 11, and the power is regulated to 10 kw. The electric power initiates discharge, and creates plasma around the titanium target 11. The surface portion 11a is subjected to an ion bombardment, and titanium particles are radiated toward the semiconductor substrate 12.

The sputtered titanium particles partially pass the through-holes 10p, and are nitrided in the gaseous mixture. As a result, a titanium nitride layer 12a is grown on the semiconductor substrate 12.

The electric power of 10 kw is so large with respect to the dimensions of the titanium target 11 that the nitrogen can not nitride the surface of the titanium target 11. On the other hand, the large electric power sputters a large amount of titanium particles, and the amount of nitrogen is too small to react with the large amount of titanium particles. The nitrogen is consumed to convert the titanium deposited on the semiconductor substrate 12 and the shield structure 10m, and hardly reacts with the titanium target 11.

Moreover, the surface orientation of the titanium target 11 prevents the titanium target 11 from nitriding. In detail, the titanium has a hexagonal lattice structure, and (001) crystal surface is the densest surface. Therefore, the sputtered surface mostly formed by (001) crystal surfaces is hardly nitrided. If (001) crystal surface is increased at 20 percent, the nitrogen increased at 15 percent can not nitride the titanium target 11. The sputtering yield on (001) surface is low. If (001) crystal surface is increased at 20 percent, the deposition rate of titanium is decreased at 20 percent. Therefore, even though the flow rate of nitrogen is small, the titanium nitride is grown on the semiconductor substrate 12.

The present inventor conformed the growth of titanium nitride without the nitriding of the titanium target as follows. The present inventor varied the total flow rate of the gaseous mixture, and changed the proportion of the nitrogen to the gaseous mixture. The present inventor analyzed the layer 12a deposited on the semiconductor wafer 12 and the sputtered surface portion. The result was shown in FIG. 4. The titanium nitride did not produce on both of the semiconductor wafer 12 and the sputtered surface in the region B1. On the other hand, while the proportion of nitrogen was falling within the region B2, the deposited layer 12a was the titanium nitride, and the sputtered surface was nitrided. However, if the proportion of nitrogen was within the region B3, the titanium nitride was deposited on the semiconductor wafer 12, and the sputtered surface was not nitrided.

Figure 1:
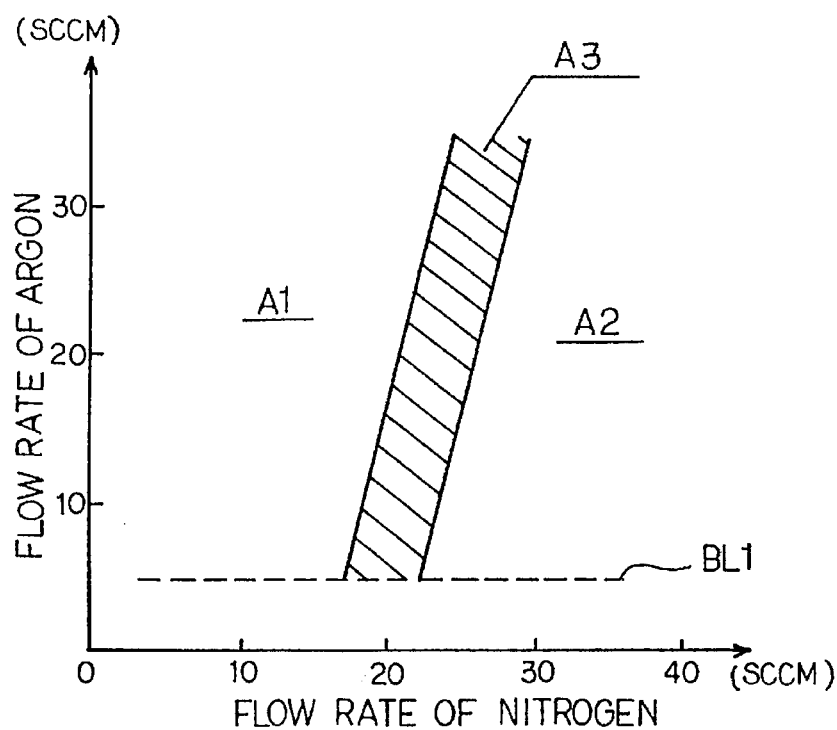
FIG. 1 is a graph showing the relation among the deposited substance, the titanium nitride on the prior art titanium target, the flow rate of nitrogen and the flow rate of argon.
Figure 4:
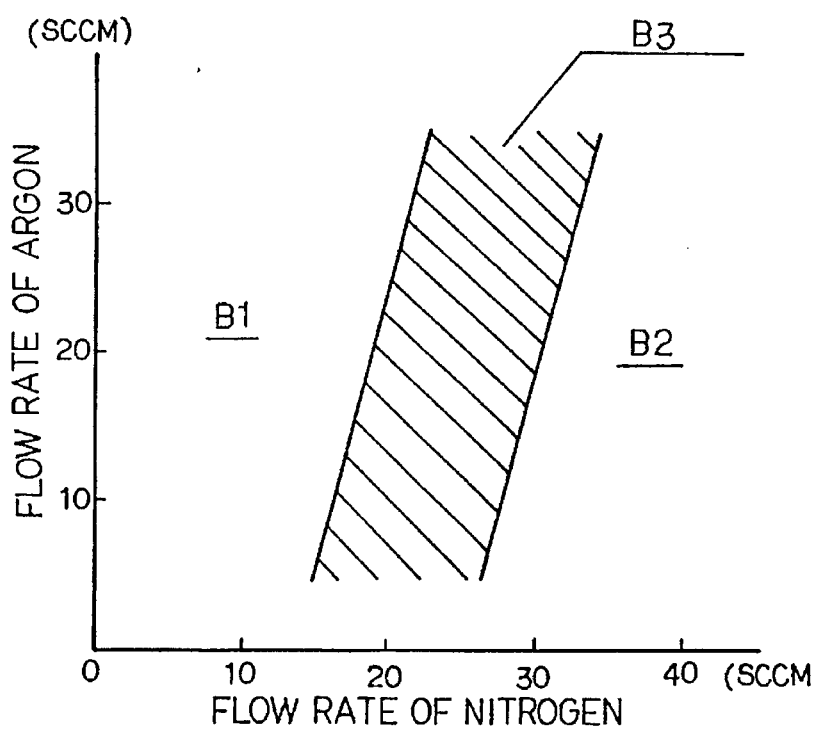
FIG. 4 is a graph showing relation among a deposited substance, titanium nitride on a titanium target according to the present invention, the flow rate of nitrogen and the flow rate of argon.

Comparing FIG. 4 with FIG. 1, the region B3 is more than two times wider than the region A3, and the nitrogen proportion is easily controllable in the reactive sputtering system according to the present invention.

The present inventor further analyzed the quality of the titanium nitride layer 12a deposited on the semiconductor wafer 12, and confirmed that the sputtering process according to the present invention never deteriorated the film quality.

Japanese Patent Publication of Unexamined Application No. 5-13368 recommends to lower the (001) surface orientation ratio, i.e., the proportion of (001) crystal surfaces <001> directions of which are within 30 degrees with respect to the normal line to the sputtered surface. Although the low (001) surface orientation ratio decreases the deposition rate, it improves the film quality. On the other hand, the present invention proposes to increase the (001) surface orientation ratio, and the high (001) surface orientation ratio allows a manufacturer to stably grow the high-quality titanium nitride layer 12a on the semiconductor wafer 12.

The present inventor measured the (001) surface orientation ratio of the commercially available titanium targets, and the (001) surface orientation ratio ranged between 60 percent and 80 percent.

In the above described embodiment, the nitrogen gas is mixed with the argon gas, and the gaseous mixture is supplied to the chamber 10b. However, the nitrogen gas may be blown to the semiconductor wafer separately from the argon gas. The directly blowing nitrogen supply nozzle prevents the titanium target 11 from nitriding, and enhances the film quality of the titanium nitride layer 12a, because the nitrogen is not undesirably consumed by the titanium deposited on the shield structure.

Second Embodiment

Figure 5:
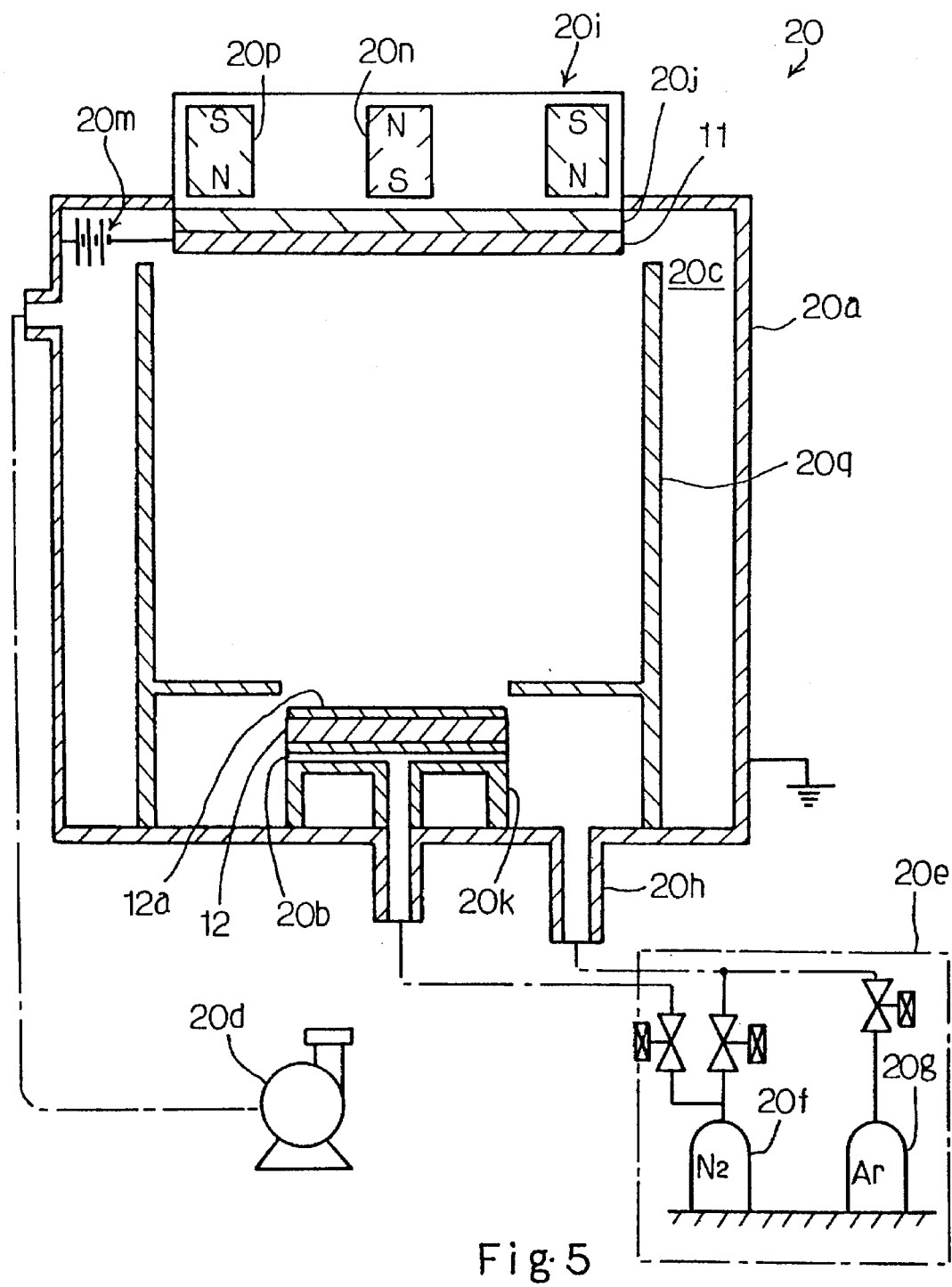
FIG. 5 is a schematic cross sectional view showing another sputtering system according to the present invention.

FIG. 5 of the drawings illustrates another magnetron sputtering system 20 embodying the present invention. The sputtering system 20 differs from the sputtering system 10 in the following points.

First, the collimator 10n is eliminated from the chamber 10b, and the sputtering system is simplified rather than the first embodiment.

Second, the distance between the titanium target 11 and the semiconductor wafer 12 is prolonged, and the titanium target 11 is prevented from the nitrogen gas.

Third, a nitrogen gas nozzle 20b is provided for the semiconductor wafer 12.

In detail, a chamber 20c is defined in the reactor 20a, and the chamber 20c is connected to a vacuum pump 20d and a gas supply sub-system 20e. A source 20f of nitrogen gas and a source 20g of argon gas are incorporated in the gas supply sub-system 20e, and gaseous mixture of nitrogen and argon is supplied from the gas supply sub-system, 20e to a main gas nozzle 20h as similar to the magnetron sputtering system 10. The source 20f of nitrogen gas is further connected to the nitrogen gas nozzle 20b, and supplies the nitrogen gas around the semiconductor wafer 12.

The magnetron sputtering system 20 further comprises a magnet assembly 20i attached to a backing plate member 20j and a substrate holder 20k confronted with the backing plate member 20j. The titanium target 11 is attached to the backing plate member 20j, and the semiconductor wafer 12 is placed on the substrate holder 20k. The titanium target 11 has the (001) surface orientation ratio equal to or greater than 90 percent as similar to that installed in the magnetron sputtering system 10. A direct current source 20m is connected to the titanium target 11, and negatively biases the titanium target 11.

The magnet assembly 20i serves as a planer magnetron sputtering electrode, and includes a center magnet 20n and a ring-shaped peripheral magnet 20p. The ring-shaped peripheral magnet 20p is opposite in polarity to the center magnet 20n, and the center magnet 20n and the ring-shaped peripheral magnet 20p create a magnetic field through the backing plate member 20j around the titanium target 11.

The magnetron sputtering system 10 further comprises a shield structure 20q accommodated in the chamber 20c, and prevents the inner wall of the reactor 20a from contamination due to sputtered substance.

As described hereinbefore, a collimator is not provided inside of the shied structure 20q. The collimator 10n provides a resistance against the gas flow toward the titanium target 11. For this reason, the nitrogen gas is liable to nitride the titanium target 11 in a chamber without the collimator 10n, and the chamber without a collimator 10n tends the nitrogen in the space around the semiconductor wafer 12 to come short.

In this instance, the reactor 20a is prolonged, and the titanium target is spaced from the gas nozzle 20h. For this reason, the titanium nitride hardly grows on the sputtered surface of the titanium target 11. It is preferable for the chamber 20c without a collimator to space the titanium target 11 from the semiconductor wafer 12 by a distance equal to or greater than the diameter of the titanium target. If the titanium target 11 is rectangular parallelopiped configuration, the distance is equal to or greater than one of the edge of the sputtered surface.

Moreover, the nitrogen gas nozzle 20b supplements the nitrogen to the space around the semiconductor wafer 12, and a high quality titanium nitride layer 12a is grown on the semiconductor wafer 12.

The magnetron sputtering system 20 achieves all the advantages of the magnetron sputtering system.

Although particular embodiments of the present invention have been shown and described, it will be obvious to those skilled in the art that various changes and modifications may be made without departing from the spirit and scope of the present invention.

For example, a target according to the present invention may be shaped into another configuration such as, for example, a rectangular parallelopiped configuration. The dimensions of the target do not set a limit on the present invention.

The present invention appertains to the magnetron sputtering systems 10 and 20 in the above described embodiments. However, the titanium target 11 is available for any kind of sputtering system, and the embodiments do not set a limit on the sputtering system.

What is claimed is:

1. A sputtering system comprising:

a vessel defining a vacuum chamber;

a wafer holder accommodated in said vacuum chamber for maintaining a substrate;

a target holder accommodated in said vacuum chamber;

a plasma generating means for generating a plasma around said target holder;

a target formed of titanium, and supported by said target holder, said target including a surface portion to be sputtered by an ion bombardment radiated from said plasma, said surface portion having (001) crystal surfaces, <001> directions of the (001) crystal surfaces falling within 30 degrees with respect to a normal line to said surface portion being equal to or greater than 90 percent of all the crystal surfaces forming said surface portion so that said surface portion is hardly nitrided; and a gas supplying means supplying gaseous mixture containing nitrogen to said vacuum chamber so as to deposit a titanium nitride layer on said substrate.

2. The sputtering system as set forth in claim 1, further comprising a collimator accommodated in said vacuum chamber between said target and said substrate and including a plurality of through-holes having respective center axes substantially normal to a surface of said substrate where said titanium nitride layer is deposited.

3. The sputtering system as set forth in claim 1, further comprising a shield structure accommodated in said vacuum chamber between said target holder and said wafer holder so as to prevent an inner wall of said vessel from contamination due to sputtered particles.

4. The sputtering system as set forth in claim 3, further comprising a collimator supported by said shield structure and including a plurality of through-holes having respective center axes substantially normal to a surface of said substrate where said titanium nitride layer is deposited.

5. The sputtering system as set forth in claim 1, in which said titanium target is spaced from said substrate by a distance equal to or greater than one of a diameter or an edge of said target defining said surface portion.

6. The sputtering system as set forth in claim 1, in which said gas supplying system further includes a gas nozzle for blowing said nitrogen to a space around said substrate.

7. A magnetron sputtering system comprising:

a reactor defining a chamber;

a wafer holder accommodated in said chamber for maintaining a semiconductor substrate;

a backing plate member accommodated in said chamber;

a shield structure accommodated in said chamber between said wafer holder and said backing plate so as to prevent an inner wall of said reactor from contamination;

a collimator supported by said shield structure, and including a plurality of through-holes so as to allow part of sputtered particles to pass therethrough, said plurality of through-holes having respective axes substantially normal to a surface of said semiconductor wafer;

a magnet assembly attached to said backing plate member so as to create a magnetic field around said backing plate member;

a plasma generating means for generating a plasma in said magnetic field;

a target formed of titanium, and attached to said backing plate member, said target including a surface portion to be sputtered by an ion bombardment radiated from said plasma, said surface portion having (001) crystal surfaces, <001> directions of the (001) crystal surfaces falling within 30 degrees with respect to a normal line to said surface portion being equal to or greater than 90 percent of all the crystal surfaces forming said surface portion so that said surface portion is hardly nitrated;

a vacuum creating means connected to said chamber for evacuating said chamber; and a gas supplying means supplying gaseous mixture containing nitrogen to said chamber so as to deposit a titanium nitride layer on said substrate.

8. A magnetron sputtering system comprising:

a reactor defining a chamber;

a wafer holder accommodated in said chamber for maintaining a semiconductor substrate;

a backing plate member accommodated in said chamber;

a shield structure accommodated in said chamber between said wafer holder and said backing plate so as to prevent an inner wall of said reactor from contamination;

a magnet assembly attached to said backing plate member so as to create a magnetic field around said backing plate member;

a plasma generating means for generating a plasma in said magnetic field;

a target formed of titanium, and attached to said backing plate member, said target being spaced from said semiconductor substrate by a distance equal to or greater than a diameter thereof, said target including a surface portion to be sputtered by an ion bombardment radiated from said plasma, said surface portion having (001) crystal surfaces, <001> directions of the (001) crystal surfaces falling within 30 degrees with respect to a normal line to said surface portion being equal to or greater than 90 percent of all the crystal surfaces forming said surface portion so that said surface portion is hardly nitrated;

a vacuum creating means connected to said chamber for evacuating said chamber; and a gas supplying means supplying gaseous mixture containing nitrogen to said chamber so as to deposit a titanium nitride layer on said substrate, and including a nozzle supplying said nitrogen to a space around said semiconductor substrate.

9. A process of depositing a titanium nitride layer on a substrate, comprising the steps of:

a) preparing a target formed of titanium and having a surface portion to be sputtered, said surface portion having (001) crystal surfaces, <001 > directions of the (001) crystal surfaces falling within 30 degrees with respect to a normal line to said surface portion being equal to or greater than 90 percent of all the crystal surfaces forming a sputtered surface of said surface portion;

b) accommodating said target and a substrate in a vacuum chamber;

c) evacuating said vacuum chamber;

d) supplying gaseous mixture containing nitrogen to said vacuum chamber; and e) generating a plasma in said vacuum chamber so as to sputter said target, sputtered titanium particles reacting with said nitrogen so that titanium nitride is deposited on said substrate essentially without nitrating said target.

10. The process as set forth in claim 9, in which an electric power for generating said plasma is regulated in such a manner as to etch titanium nitride produced on said sputtered surface of said surface portion.

11. The process as set forth in claim 10, in which said plasma is generated in a magnetic field, and said electric power is 10 kilo-watt for said target having a diameter of 300 millimeters.

12. The process as set forth in claim 9, in which said sputtered titanium particles are partially eliminated by a collimator having a plurality of through-holes, center axes of which are substantially normal to a surface of said substrate where said titanium nitride is deposited.

13. The process as set forth in claim 9, in which said nitrogen gas is blown to a space so as to create a nitrogen-rich ambience around said substrate.

* * * * *